United States Patent [19]

Norman et al.

[11] Patent Number: 4,903,223
[45] Date of Patent: Feb. 20, 1990

[54] PROGRAMMABLE LOGIC DEVICE WITH PROGRAMMABLE WORD LINE CONNECTIONS

[75] Inventors: Kevin A. Norman, Belmont; Robert J. Frankovich, Cupertino, both of Calif.

[73] Assignee: Altera Corporation, Santa Clara, Calif.

[21] Appl. No.: 190,571

[22] Filed: May 5, 1988

[51] Int. Cl.[4] .............................................. G06F 7/38
[52] U.S. Cl. ..................................... 364/716; 307/465
[58] Field of Search ......................... 364/716; 307/465

[56] References Cited

U.S. PATENT DOCUMENTS

| | | | |
|---|---|---|---|
| 3,566,153 | 2/1971 | Spencer | 307/205 |
| 4,124,899 | 11/1978 | Birkner et al. | 364/716 |
| 4,609,986 | 9/1986 | Hartmann et al. | 364/200 |
| 4,617,479 | 10/1986 | Hartmann et al. | 307/465 |
| 4,677,318 | 6/1987 | Veenstra | 307/465 |
| 4,703,206 | 10/1987 | Cavlan | 307/465 |
| 4,713,792 | 12/1987 | Hartmann et al. | 364/900 |
| 4,761,768 | 8/1988 | Turner et al. | 364/716 X |
| 4,763,020 | 8/1988 | Takata et al. | 307/465 |
| 4,771,285 | 9/1988 | Agrawal et al. | 307/465 X |
| 4,772,811 | 9/1988 | Fujioka et al. | 307/465 |
| 4,789,951 | 12/1988 | Birkner et al. | 364/716 |

OTHER PUBLICATIONS

R. R. Munoz et al., "Automatic Partitioning of Programmable Logic Devices," *VLSI Systems Design*, Oct. 1987, pp. 74–76, 78, and 86.

J. C. Leininger, "Universal Logic Module," *IBM Technical Disclosure Bulletin*, vol. 13, No. 5, pp. 1294–1295, Oct. 1970.

E. Goetting et al., "A CMOS Electrically-Reprogrammable ASIC with Multi-Level Random Logic Capabilities," 1986 *IEEE International Solid-State Circuits Conference*, pp. 244–245 and 359–360, 1986.

*Primary Examiner*—David L. Clark
*Assistant Examiner*—Tan V. Mai
*Attorney, Agent, or Firm*—Robert R. Jackson

[57] ABSTRACT

A programmable logic device having a relatively small number of programmable product terms ("P-terms") feeding each fixed combinatorial logic device, and additional "expander" programmable P-terms which do not directly feed a fixed device. Relatively simple logic functions can be performed by suitably programming the P-terms feeding the fixed devices. More complex logic functions can be performed by suitably programming the required number of expander P-terms, and then combining the outputs of those P-terms by means of another P-term. In order to conserve word lines in the programmable array, multiplexers allow selection of whether expander outputs or external inputs will be applied to certain word lines.

10 Claims, 14 Drawing Sheets

| PRE | CLR | D | CLK | Q |
|---|---|---|---|---|
| 1 | 1 | 0 | ⌐ | 0 |
| 1 | 1 | 1 | ⌐ | 1 |
| 1 | 0 | X | X | 0 |
| 0 | 1 | X | X | 1 |
| 0 | 0 | X | 0 | $Q_0$ |
| 0 | 0 | 0 | 1 | 0 |
| 0 | 0 | 1 | 1 | 1 |

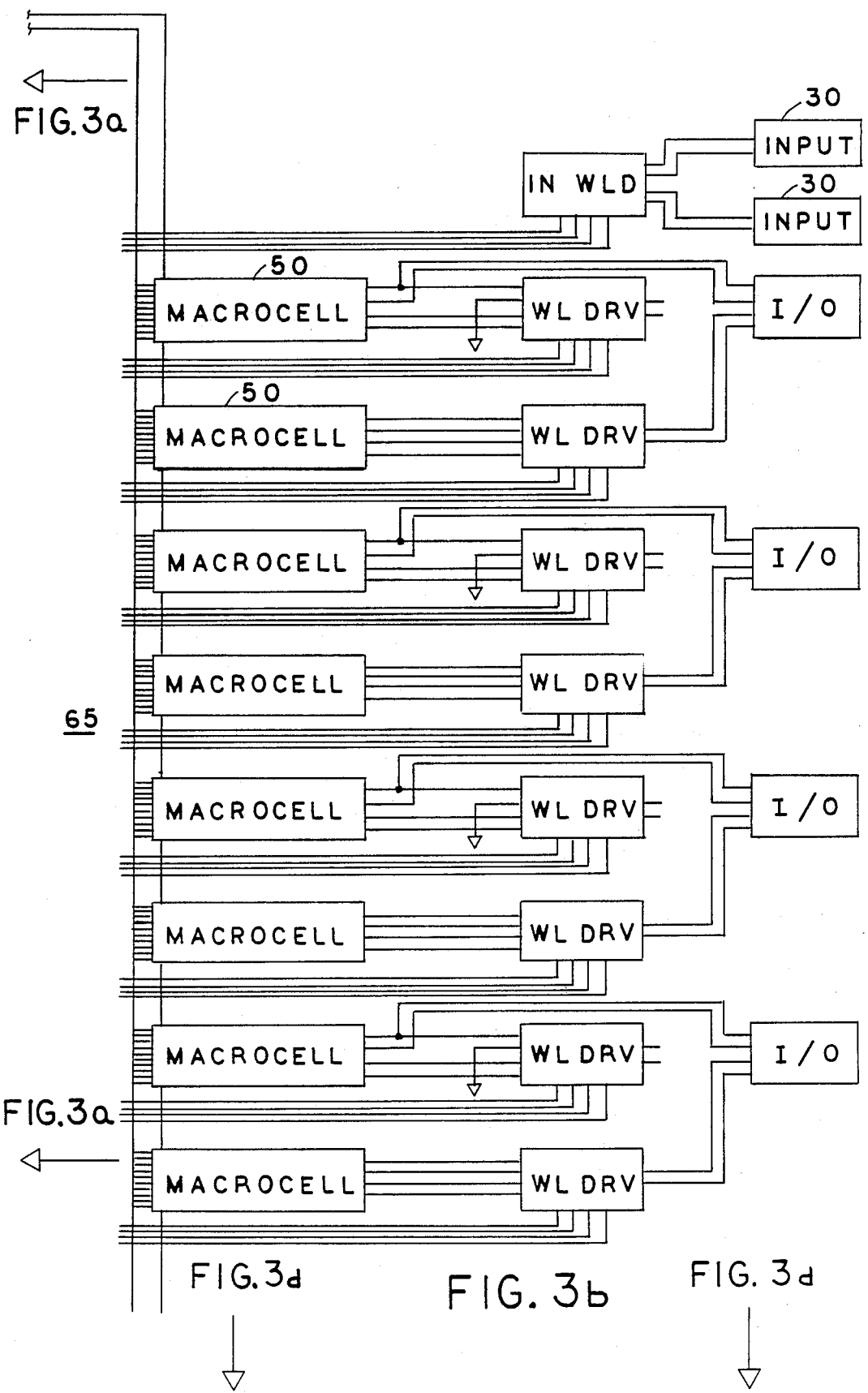

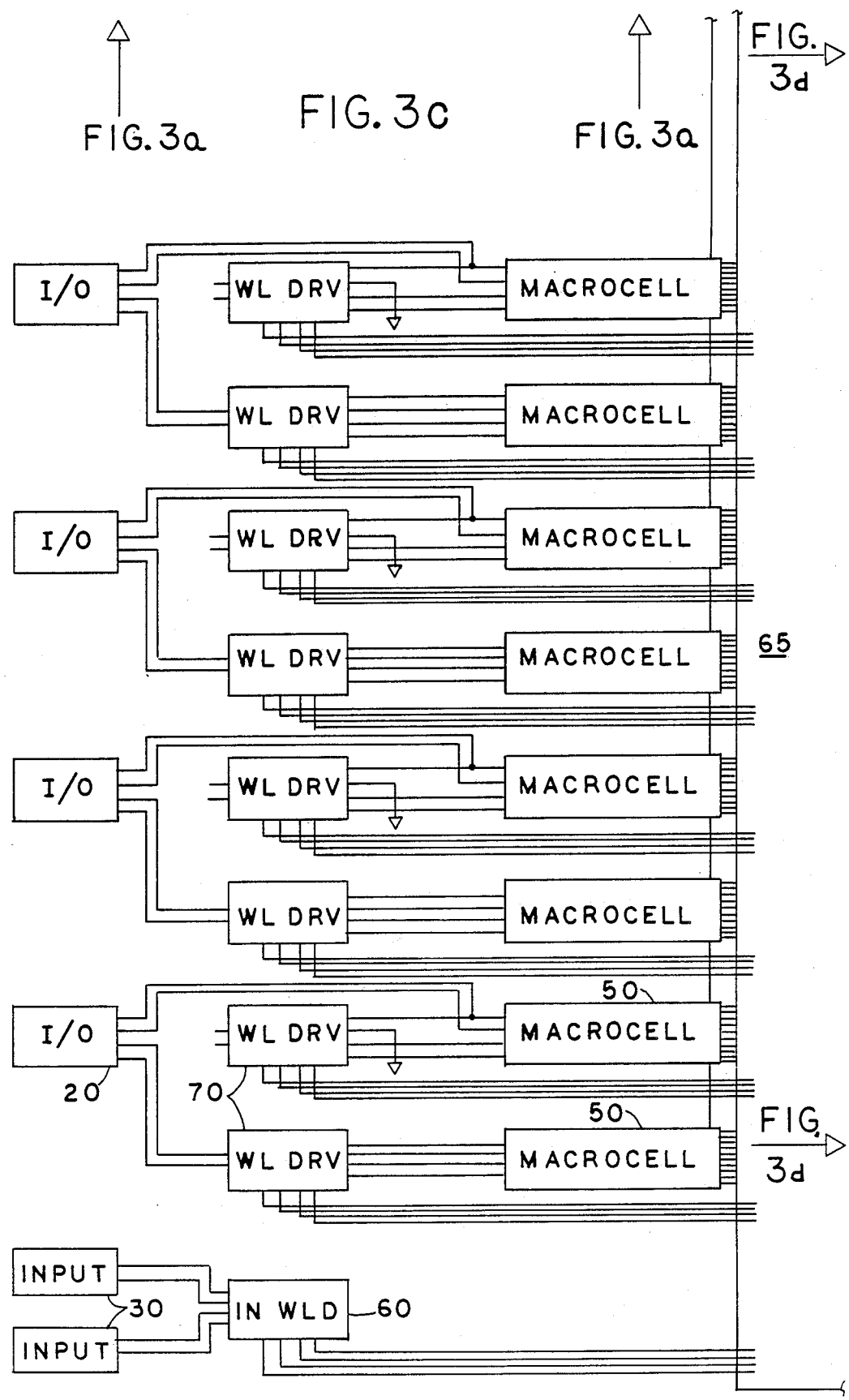

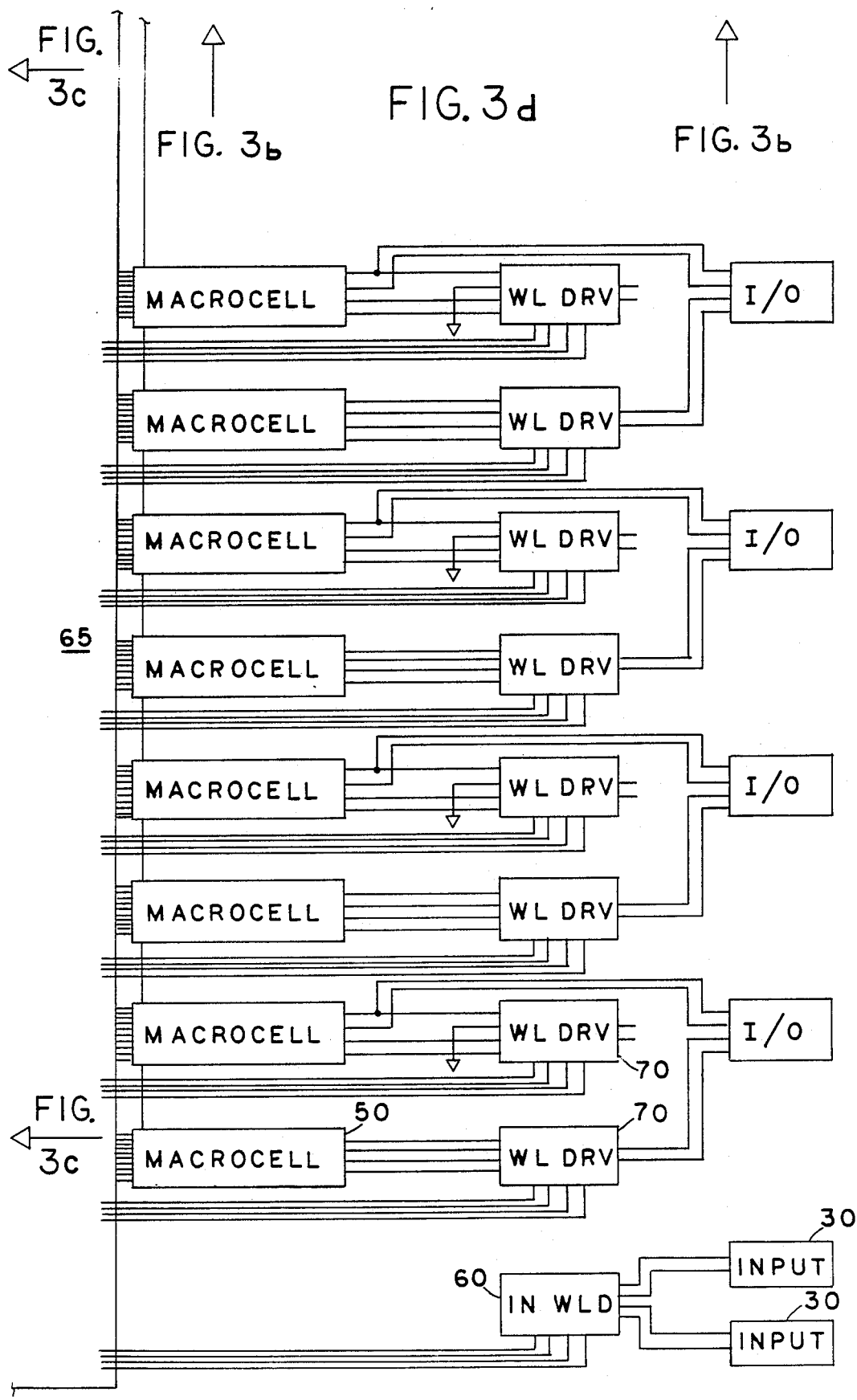

FACTORING OUT EXPANDERS

FITTING ON EXPANDERS

PROGRAMMABLE LOGIC DEVICE WITH PROGRAMMABLE WORD LINE CONNECTIONS

BACKGROUND OF THE INVENTION

This invention relates to programmable logic integrated circuits. In particular, the invention relates to a new architecture which provides for greater utility and flexibility of programmable logic devices ("PLDs"), and allows for programmable logic devices of much greater complexity than previously were possible.

The following references are background to this invention: Hartmann et al. U.S. Pat. No. 4,617,479; Hartmann et al. U.S. Pat. No. 4,609,986; Veenstra U.S. Pat. No. 4,677,318; Hartmann et al. U.S. Pat. No. 4,713,792; Birkner et al. U.S. Pat. No. 4,124,899; Cavlan U.S. Pat. No. 4,703,206; Spencer U.S. Pat. No. 3,566,153; J. C. Leininger, "Universal Logic Module", *IBM Technical Disclosure Bulletin*, Vol. 13, No. 5, October 1970, pp. 1294–95; Ronald R. Munoz and Charles E. Stroud, "Automatic Partitioning of Programmable Logic Devices", *VLSI Systems Design Magazine*, October 1987, pp. 74–78, and 86; and E. Goetting et al., "A CMOS Electrically-Reprogrammable ASIC with Multi-Level Random Logic Capabilities", 1986 *IEEE International Solid State Circuits Conference (Proceedings)*, pp. 244, 245, 359, and 360. All of these references are hereby incorporated by reference herein.

Several approaches have been used for the architecture of programmable logic integrated circuits. Among these are the "programmable AND, fixed OR" structure (referred to as a PAL) used in the above-mentioned Birkner et al. patent. This architecture has the advantages of higher speed and a simpler structure. However, because it has a fixed number of "product terms" ("P-terms") per OR logic function (eight P-terms is typical of most current PAL products), and because these P-terms cannot be shared by neighboring OR gates, many P-terms are typically wasted. On the other hand, there are many occasions when eight P-terms are not enough to handle the more complex logic functions. Experience has shown that in a broad range of applications, eight P-terms is much more than enough (on average), and yet it is often insufficient. For example, FIG. 2 in the above-mentioned Munoz et al. article is a graph of P-term requirements for a relatively large sample of logic functions (Munoz et al. FIG. 2 is substantially reproduced herein as FIG. 1). Similar studies done by the assignee of the present invention arrive at roughly similar conclusions: namely, a large percentage of logical functions (on the order of 50 to 70 percent) require less than four P-terms. However, a relatively significant "tail" exists where eight P-terms is not enough.

One way to achieve higher P-term utilization is to provide "variable P-term distribution". In essence, this is an to attempt to guess a mixture of P-term requirements such that some OR gates have few P-terms (e.g., four), and some have a relatively large number (e.g., 12 or 16). See, for example, above-mentioned U.S. Pat. No. 4,609,986. This partially solves the problem of P-term utilization, but it significantly increases the complexity of the software support task because each function must be examined and then, depending upon its demand for P-term resources, assigned to a specific macrocell which has the minimum resources needed to fulfill the required demand (this process is called "fitting"). However, even with variable P-term distribution, many P-terms are still wasted.

Another way in which this P-term allocation problem can be solved is suggested in the abovementioned paper by Leininger. With this structure, the P-term array is viewed as an array of programmable NOR or NAND gates whose inputs are programmable. Functions which require more than a single P-term are broken into multi-level NAND (or NOR) functions. Each level of (e.g., NAND) logic takes one P-term. Using this type of array, even quite complex logic functions can be done in a few levels of NAND logic. Again, however, there are some drawbacks. First, it is very likely that most logic functions will take more than a single P-term. This means that most often, two passes through the array will be required, and this causes a slowing down of evaluation of the function. Second, each P-term must feed back into the array input section. Thus, as the number of P-terms grows, so does the number of input lines. Even for arrays of modest complexity, the number of input signal lines (sometimes called "word lines") becomes excessive. For example, the part described in the above-mentioned IEEE ISSCC paper has only eight macrocells but has nearly 100 word lines, while a PAL circuit of similar complexity has only half as many word lines. Each word line adds to the length (and therefore the parasitic capacitance) of all of the P-terms. Greater P-term length leads to slower part operation.

Finally, there are programmable logic arrays ("PLAs") of the type described in the above-mentioned Spencer patent. Most (if not all) functions can be accomplished in one pass through the "AND" array plus one pass through the "OR" array. However, even the simplest functions require these two array delays. Thus, compared to the PAL architecture, there is a speed penalty (for all functions regardless of complexity). This type of PLA circuit is also more complex to execute in silicon because of the need for interface buffering between the AND and the OR array, and because of the inherently more complex programming circuits needed to program the two arrays.

In view of the foregoing, it is an object of this invention to provide an architecture for programmable logic devices which allows for the implementation of PLDs of much greater complexity.

It is another object of the invention to maximize the utilization of word lines and P-terms in PLDs.

It is a further object of the invention to make PLDs of high complexity that can operate at high speed.

It is a further object of the invention to provide a macrocell which is simpler and provides for increased functionality.

It is a further object of the invention to provide a regular, repeatable architecture which will be easy for a user to understand and easy for software tools to support.

It is a further object of the invention to create a modular architecture in which the number of macrocells can be easily increased or decreased, thereby permitting many variations of the same basic design.

It is another object of the invention to provide programmable logic devices which respond correctly to noisy or slowly changing input signals.

SUMMARY OF THE INVENTION

The present invention solves all of the above problems, and in addition provides a programmable word line connection structure which allows the implementation of much larger programmable logic devices (PLDs) than have heretofore been possible. Among the major elements of the present invention are (1) the macrocell logic block shown in FIGS. 4 and 5a-b; (2) the flip-flop block shown in FIGS. 4-6; (3) the programmable word line connection structure shown in FIGS. 4 and 5a -b; and (4) the clock functions shown in FIG. 6.

A. The Macrocell Logic Block

As mentioned above, the present invention solves all of the problems associated with prior art devices and facilitates a maximum usage of P-terms. Most functions (e.g., counters, demultiplexers, 2-to-1 and 4-to-1 multiplexers, and shift registers, as well as any simple AND, OR, NAND, or NOR function) can be done in one pass through the array. Many more complex functions which require three or less P-terms or which can directly utilize the EXCLUSIVE-OR gate (XOR) can also be done directly in a single pass through the array. This accounts for approximately 70% of the logic functions that are found in most logic designs. The remaining functions which require additional product terms can be done by the use of "expander" P-terms which (in combination with the three-P-term programmable AND, fixed OR, XOR) can produce very complex NAND-NAND, AND-OR, OR-AND, and NOR-NOR types of functions. The general advantage of this combined structure is that a majority of logic functions can be done in one pass through the array (thus achieving maximum speed), and even the most complex functions can be done in two passes.

B. The Flip-Flop Block

The output of the above-mentioned AND-OR-XOR structure feeds into a flip-flop logic block. In prior art circuits such as the EP300 (available from Altera Corporation of Santa Clara, Calif.; see U.S. Pat. No. 4,617,479) this is typically a conventional D flip-flop with a mechanism for allowing the flip-flop register to be optionally bypassed so that the combinatorial output can be applied directly to the output section if desired. In the device described herein, this structure has been modified such that the multiplexer and attendant control formerly required to bypass the flip-flop are no longer necessary. In place of the old structure, a new flip-flop structure has been incorporated which allows operation as a D flip-flop, a level-sensitive latch, or a completely flow-through device which allows combinatorial functions to be directly propagated. A preferred structure for this new flip-flop is described in concurrently filed, commonly assigned, co-pending patent application Ser. No. 190,530, U.S. Pat. No. 4,864,161, which is hereby incorporated by reference herein.

C. Programmable Word Line Connections

In prior art programmable logic devices, a major obstacle to increasing the logic density has been array sizes which increase in proportion to the number of input variables (word lines) to the array. For complete generality, all input and I/O input pin signals, as well as all macrocell and expander signals, must be fed into the array. As the number of macrocells and I/O signals increases, one reaches a point where the programmable array grows beyond reasonable bounds. However, it has been observed that not all of these logical variables are needed for all applications. That is, on average, only some subset of functions needs to be fed back. Therefore it is desirable to find a way in which to programmably choose which variables will be used in each particular application. In the present invention, this choice is made by selecting between expander feedback signals and I/O feedback signals. In one particular implementation, there are 64 expanders and 64 associated word lines. There are also 16 dual-polarity I/O input lines. The user can "trade off" expanders for I/O inputs. For example, it is possible to have a device configured to have 16 inputs (which use up 32 of the 64 word lines) and still have 32 expanders. On the other hand, one may not need any of the I/O input lines, in which case all 64 expanders can be used for logic functions. Obviously, all cases in between these limits are also possible as two expanders trade for one true-complement input.

D. Input/Output

In most prior art programmable logic devices, certain package pins are designated as inputs and others as outputs (see, for example, the MMI 16R8, commercially available from Monolithic Memories Incorporated (now merged with and part of Advanced Micro Devices ("AMD") of Sunnyvale, Calif.). An improvement on this has been the use of tri-state buffers in conjunction with a feedback path from the I/O pin back into the array such that when the output buffer is in its tri-state condition, the pin may be used as an input (see the above-mentioned Birkner et al. patent). This mechanism provides for flexibility of usage of pin resources. However, when the I/O buffer is tri-stated and the associated pin is used as an input, the associated output macrocell logic is lost. This is a waste of precious resources. A solution to this problem is provision for "dual-feedback" such as that found on certain pins of the Altera EP1800. Dual feedback provides for two feedback paths: one from the I/O pin, and one from its associated logic macrocell. Thus when the output buffer is tri-stated, the I/O pin may be used as an input, and the macrocell feedback is still present. Therefore, the macrocell resource can still be used as a "buried register". In the present device, this mechanism is further improved in that I/O pin feedback does not go directly into the array, but rather is an input to a selection block. In this selection block, a choice is made to either feed back the I/O input signal or to feed back the associated expanders. Thus I/O pin functions are effectively decoupled from the logic arrays and the macrocells. This provides for much greater utility and flexibility than was heretofore possible.

E. Input Hysteresis

In prior art programmable logic devices, input buffers have been a conventional inverter whose input switching point is set to match a prescribed specification. It is desirable that PLDs work reliably in a large variety of environments. Often these environments are electrically noisy. In these instances, the simple input inverter structure cannot cope. As input signals make transitions from logic 0 to logic 1 (or vice versa), noise may cause an input to cross and recross the threshold level of the input inverter. This "noise" will be propagated through the chip and cause erronous outputs. A special type of buffer structure with hysteresis (this circuit is generally called a "Schmitt Trigger") can prevent such problems. This hysteresis circuit has built-in noise margin. There is a gap between the logic 1 threshold and the logic 0 threshold. Once the logic 1 level has been exceeded, the input signal must retrace below the logic 0 level before the buffer will switch again. In like manner, in a transition from 1 to 0, once the 0 level threshold has been crossed, the input signal must retrace to the logic 1 threshold before the buffer will switch again. This hysteresis effect is very advantageous in PLDs because of the wide variety of environments in which they are likely to be used.

F. Cock Functions

Generally, the register functions in PLDs are clocked either synchronously (for example, see the MMI 16R8) or asynchronously (see the MMI 20RA10). In most systems, there is a need for both types of capabilities. A solution to this problem is the structure that has been used in the Altera EP600, EP900, and EP1800. In these devices a multiplexer has been provided which allows the user to select either the synchronous (global) clock signal or an "asynchronous" (local P-term) clock. This selection can be made on a macrocell-by-macrocell basis. However, this multiplexer structure adds to the complexity of the device, and the additional circuitry needed to make the selection adds delay to the clock signal. An improved approach has been taken in the present device which allows for a simple clock gating of the "global" synchronous clock with a local P-term. If the synchronous clock is desired, then the asynchronous clock P-terms are programmed such that they are always low which allows the global clock signal to pass to the flip-flop. If asynchronous clocking is desired, the global clock signal is forced low (again by programming) and the local P-term is allowed through to clock the flip-flop. This structure completely eliminates the clock multiplexer and the controls for same. This new structure is simpler and faster.

In concurrently filed, commonly assigned, co-pending patent application Ser. No. 190,663, which is hereby incorporated by reference herein, a somewhat similar clock structure has been described. An added feature of the present embodiment is the ability to provide global "synchronous" clock signals which are either logically "in phase" with the corresponding input signal or logically "out of phase" (i.e. inverted) with the corresponding input signal. In the present invention the device is divided into two halves, each containing 16 macrocells. There is a separate global clock line for each half, each driven by the same external pin. The logical phase of these two lines can be independently controlled to be either in-phase or out-of-phase with the external signal. This feature can be extremely important in a high-speed, pipelined, synchronous system.

Further features of the invention, its nature and various advantages will be more apparent from the accompanying drawings and the following detailed description of the invention.

BRIEF DESCRIPTION OF THE DRAWINGS

FIGS. 3a-3d is a block diagram of a preferred embodiment of the present invention.

DETAILED DESCRIPTION OF THE PREFERRED EMBODIMENTS

Figure 1:
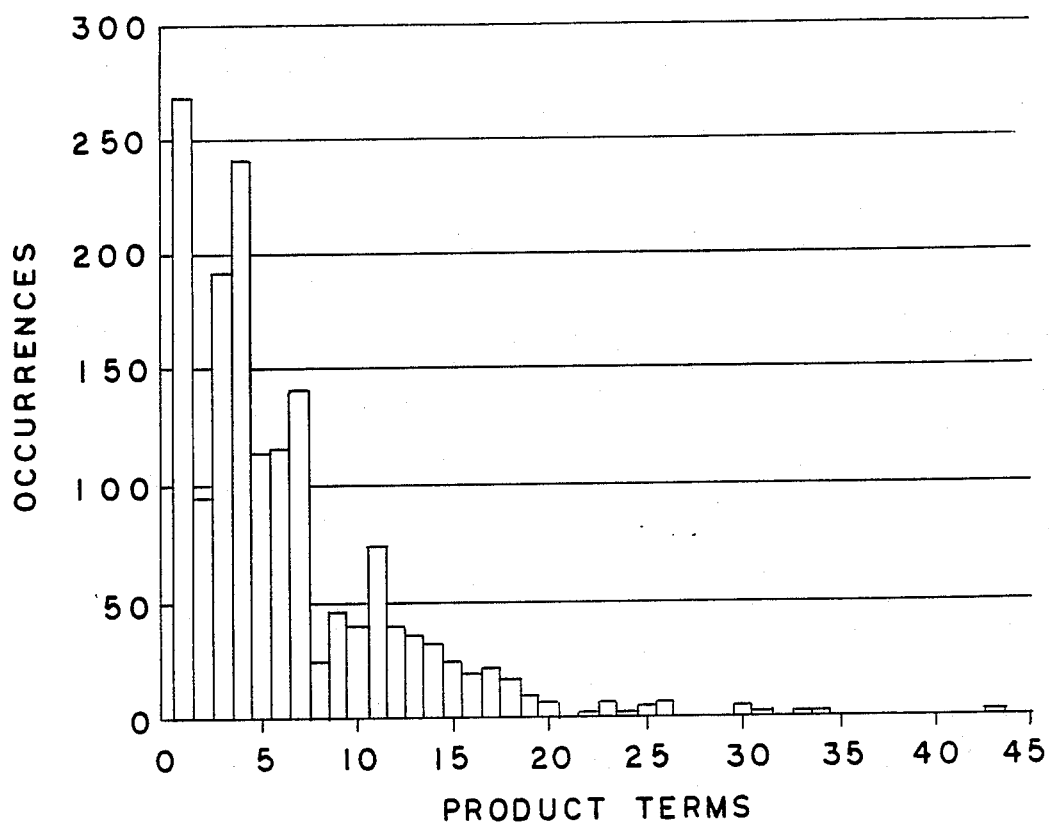
FIG. 1 is chart showing product term distribution (frequency of occurrance of logic functions requiring a given number of product terms to implement the same) for a large sample of PLD designs.

FIGS. 3a-3d are an overall block diagram 10 of a preferred embodiment of a programmable logic device 10 constructed in accordance with the present invention. The major elements shown in this diagram are dedicated inputs 30 and 30', I/O blocks 20, input word line driver blocks 60, I/O word line driver blocks 70, macrocell blocks 50, and programmable array 65. Input signals to chip 10 come either from dedicated inputs 30 and 30' or from I/O input pins 40 within I/O blocks 20 (FIGS. 4 and 5a-5b) through their respective word line drivers 60 and 70 into programmable array 65. Input 30' is a special case of a dedicated input in that it serves both as an input to array 65 and also as the "synchronous clock" signal for the flip-flops in the macrocells as will be explained later.

In the preferred embodiment, there are eight dedicated inputs 30 and sixteen I/O blocks 20. In other embodiments other selections have been made. For example, alternate versions have twelve and eight I/O blocks. It is one of the benefits of the present invention that devices of greater or lesser complexity are easily designed because of the modular nature of the architecture. Other embodiments could be designed without departing from the scope and spirit of the invention.

Figure 4:
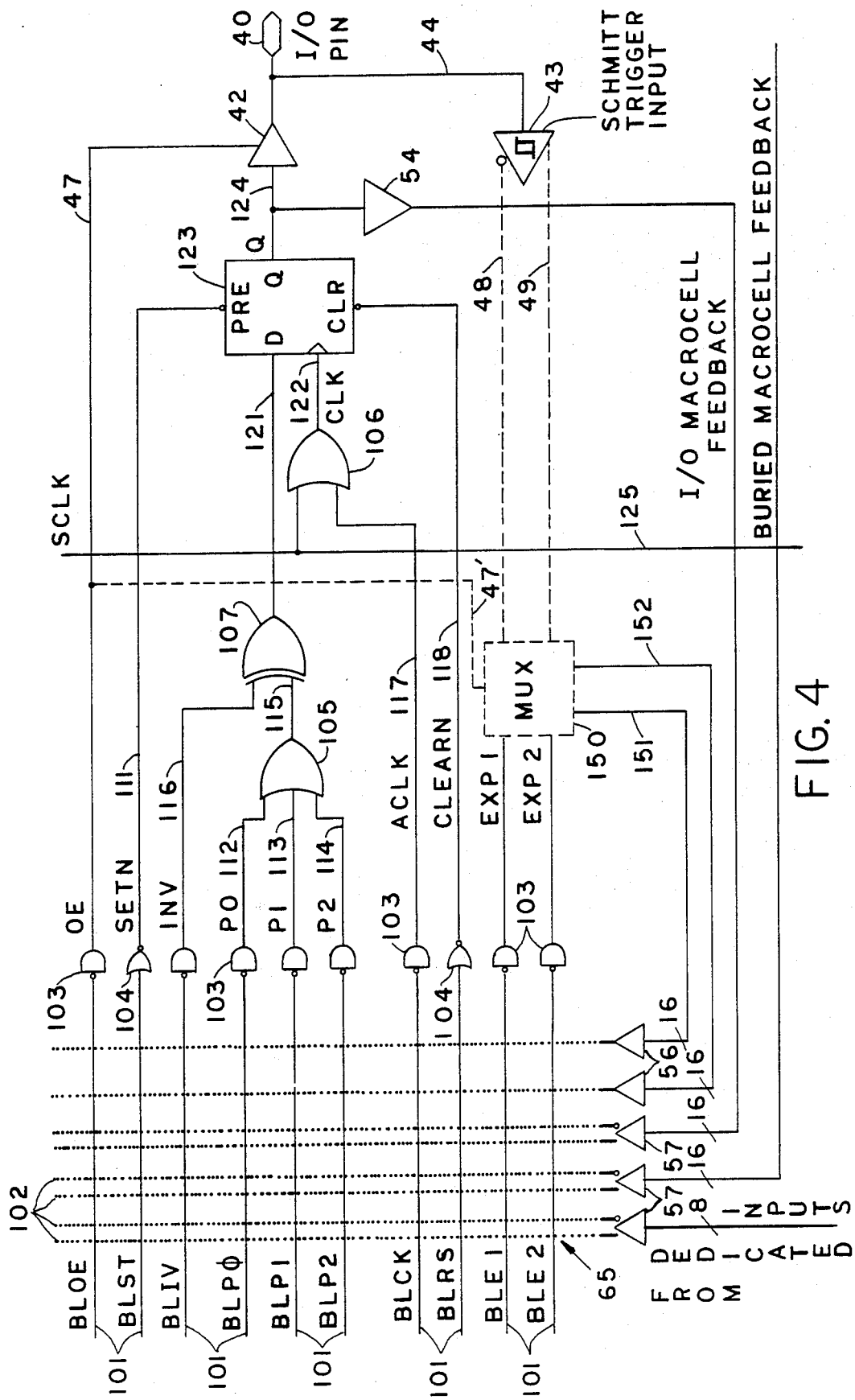
FIG. 4 is a logical representation of one macrocell.

Referring now to FIG. 4, we will explain the functioning of one of the macrocells 50 from FIG. 3. (FIG. 4 shows in solid lines the configuration of an "output" macrocell. If the macrocell were an "input" macrocell, output buffer 42 would be omitted, and the elements shown in broken lines would be operative.) FIG. 4 also shows a portion of programmable array 65 (on the left) and includes word lines 102 and product terms ("P-terms") 101. At the intersection of each word line 102 with each P-term 101 there is a programmable element which, when programmed in one state, provides a connection between that word line and that P-term, and when programmed in the other state, provides no such connection. In the preferred embodiment, the programmable elements are EPROM transistors. However, other types of programmable elements such as EEPROM transistors, fuses, anti-fuses, or other similar elements could be used without departing from the scope and spirit of the invention. The way in which logic functions can be created by programming the EPROM elements is described in detail in U.S. Pat. No. 4,617,619 and will therefore not be repeated here. The word lines receive their logical inputs from the dedicated inputs, macrocell feedback lines, and I/O input feedback lines multiplexed with input macrocell "expander" P-terms. In the preferred embodiment shown, there are $8 \times 2 = 16$ (true and complement) word lines which originate with dedicated inputs; there are $16 \times 2 = 32$ (true and complement) word lines which originate with input macrocells; there are $16 \times 2 = 32$ word lines which originate with output macrocells; there are 32 single-polarity word lines which originate with logic expanders in the output macrocells; and there are 32 (single-polarity only) word lines which originate with true and complement I/O input lines multiplexed with input macrocell expander P-terms. The total word line count is 144 for this embodiment.

Continuing with the description of FIG. 4, there are ten P-terms 101 feeding the macrocell. The logical outcome produced by the P-term is represented as either an "active-low AND" function shown as 103 or as a NOR gate 104. Those skilled in the art will recognize that other representations could be shown without departing from the scope and spirit of the invention. For example, an active-high AND gate could be used if one notes that the opposite polarity word line were used as its input and thus achieve the same logical result.

The purpose of each P-term is as follows: The P-term labeled OE is used as the output enable for the associated output buffer 42. If this were an input macrocell, this bit line would be used as the control for multiplexer 150 as is explained later. SETN is used to control the preset of flip-flop 123. The three terms P0, P1, and P2 feed OR gate 105 which produces a logical sum-of-products at its output 115. This collection of P-terms, in conjunction with gate 105, forms the "programmable AND, fixed OR" function described in U.S. Pat. No. 4,124,899. The term labeled INV is used as an "invert control" for EXCLUSIVE-OR ("XOR") gate 107. This allows for the creation of inverted sum-of-product functions at line 121. This will be recognized by those skilled in the art as expanding the number of possible functions which can be realized. In addition to acting as a static control for inverted sum-of-products, the INV term can be used "dynamically" as a direct input to XOR gate 107. For example, any logic function which can be reduced to (1) an EXCLUSIVE-OR of an AND function with an AND-OR function, (2) an EXCLUSIVE-OR of an OR function with an OR-AND function, (3) an EXCLUSIVE-OR of an OR function with an AND-OR function, or (4) an EXCLUSIVE-OR of an AND function with an OR-AND function can be implemented directly in one pass through the array. (This is shown in detail in FIGS. 7a and 7c; the dollar sign in FIG. 7a represents the EXCLUSIVE-OR function.) ACLK is used to create an "asynchronous" clock signal for flip-flop 123 in conjunction with gate 106 and the logic which controls line 125 which will be explained when describing FIG. 6. CLEARN is used to control the "clear" line to flip-flop 123. EXP1 and EXP2 are the "expander" P-terms.

Our assignee has studied the most often used logic functions in relation to a variety of possible architectures. In particular, the AND-OR-XOR structure of P0, P1, P2, OR gate 105, and XOR gate 107 was analyzed assuming both less than three AND P-terms (e.g., two AND P-terms) feeding OR gate 105, and more than three AND P-terms (up to eight AND P-terms such as is used in the prior art macrocell of FIG. 2) feeding the OR gate. The classes of functions included the following: adders, comparators, counters, decoders, demultiplexers, parity generators, and shift registers. The purpose of the study was to evaluate the architecture of the present invention relative to the prior art architecture of FIG. 2. This new architecture is a combination of three programmable ANDs, a fixed OR, and an XOR, with single P-term "expanders". This architecture is believed to be superior to both the prior art structure shown in FIG. 2 and to the single-P-term architectures proposed by Goetting et al. The study bore this out and reached several other important conclusions. It was found that having less than three P-terms feeding the OR gate is very restrictive when doing counters and shift registers. For all other functions examined, three P-terms feeding the OR gate was always as good as four P-terms feeding the OR. (This is only true assuming that in either case there is the additional INV P-term and XOR gate 107.) The prior art eight-P-term architecture is only superior for a very limited group of functions (for example, multiplexers with more than four inputs). The study also demonstrated that having approximately two expander P-terms per macrocell was more than sufficient to accommodate the less common functions which require many P-terms.

Figure 7A:
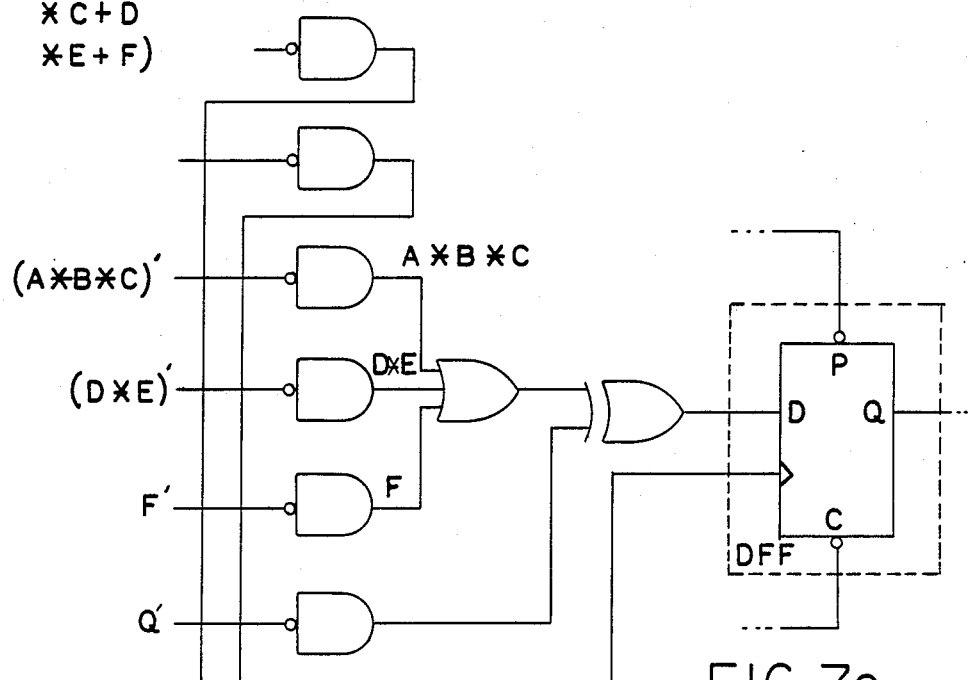
FIGS. 7a through 7h illustrate the way in which logic functions of varying complexity can be fit into the macrocell of the present invention.
Figure 7B:
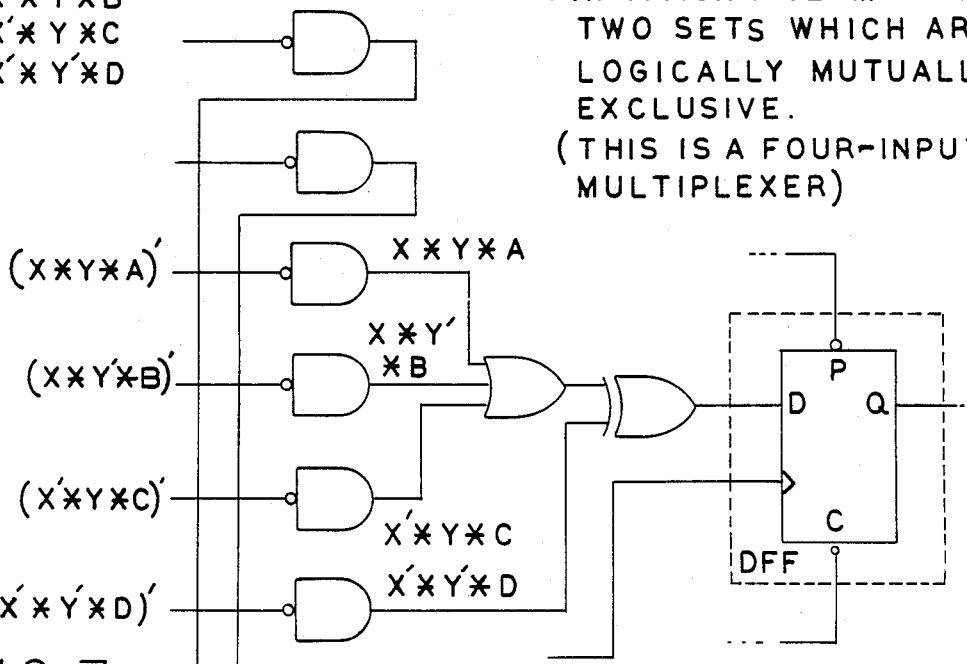
Figure 7C:
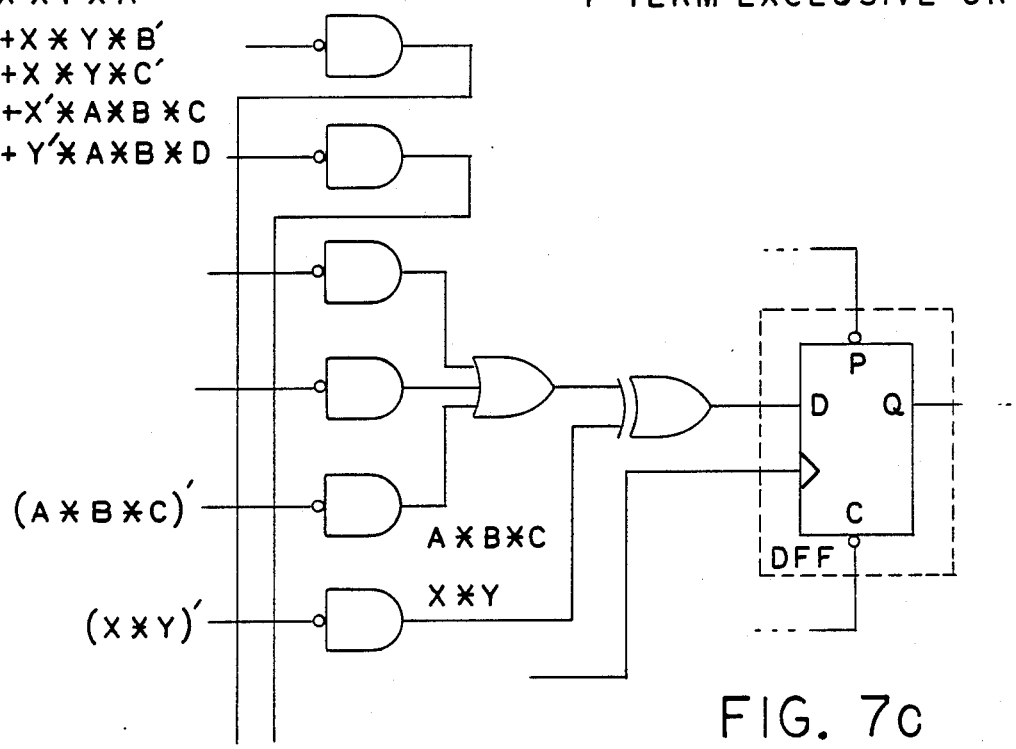
Figure 7D:
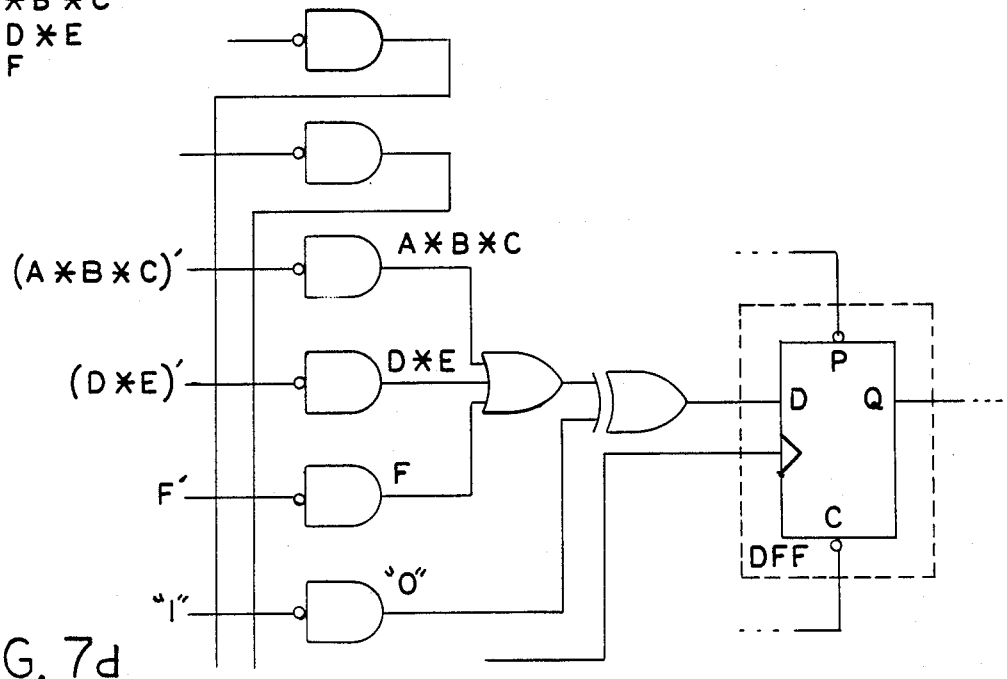
Figure 7E:
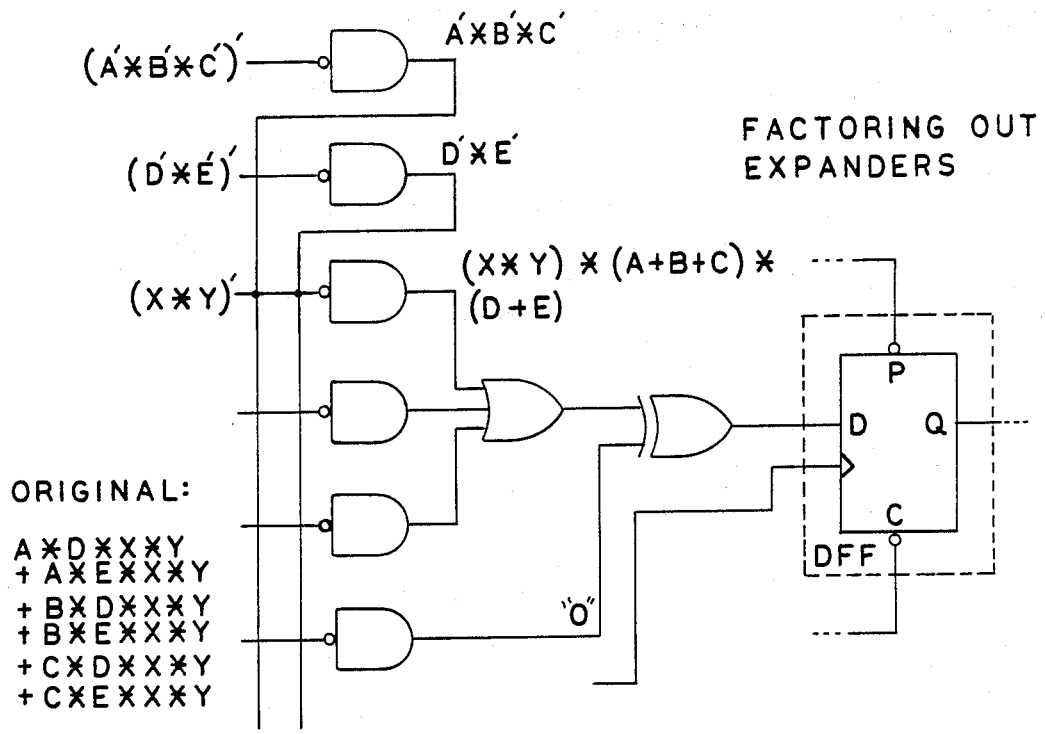
Figure 7F:
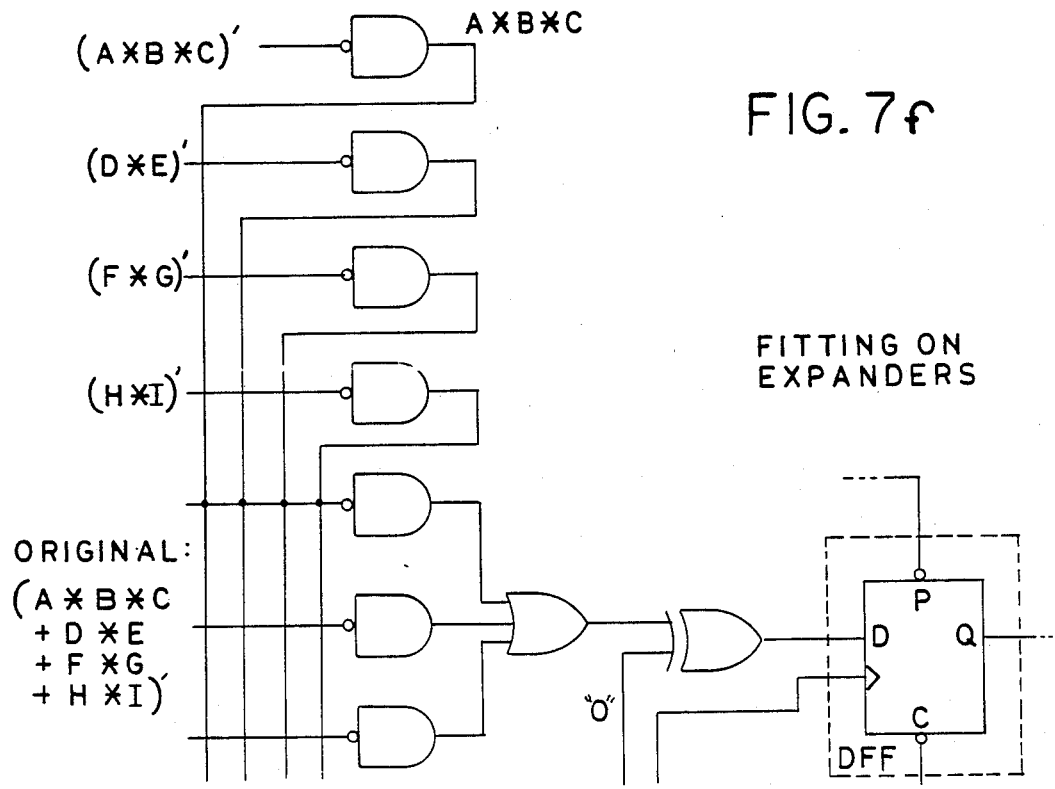
Figure 7G:
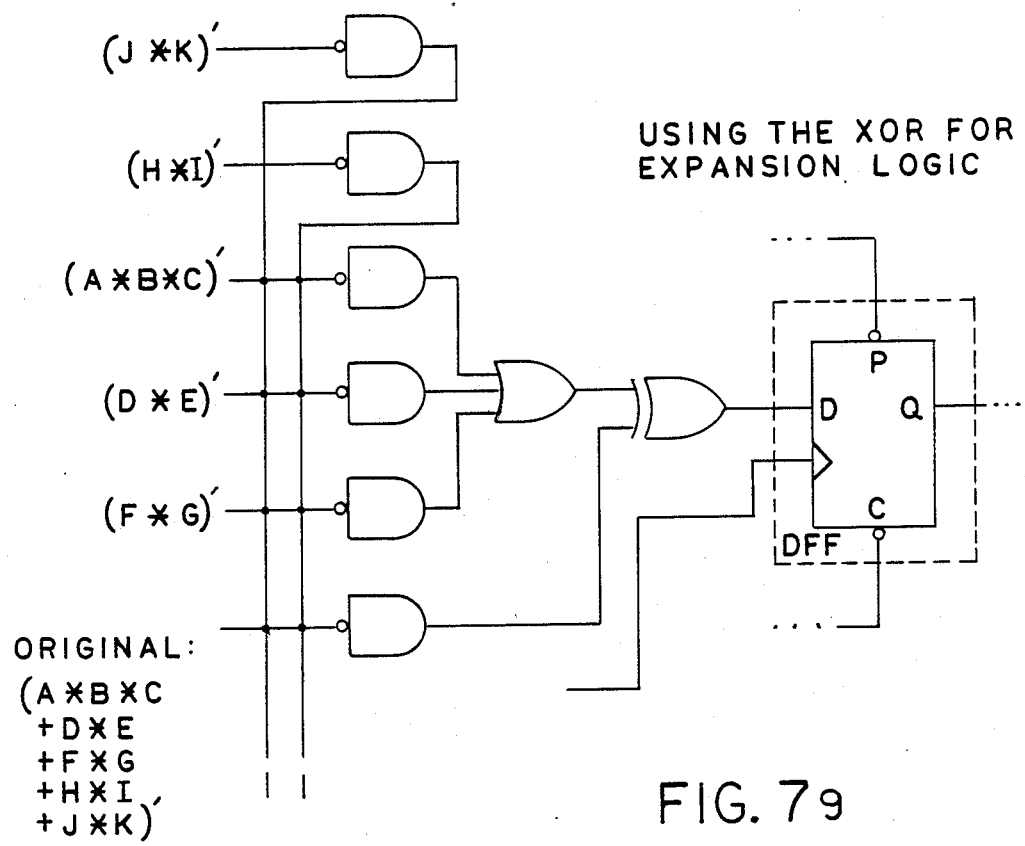
Figure 7H:
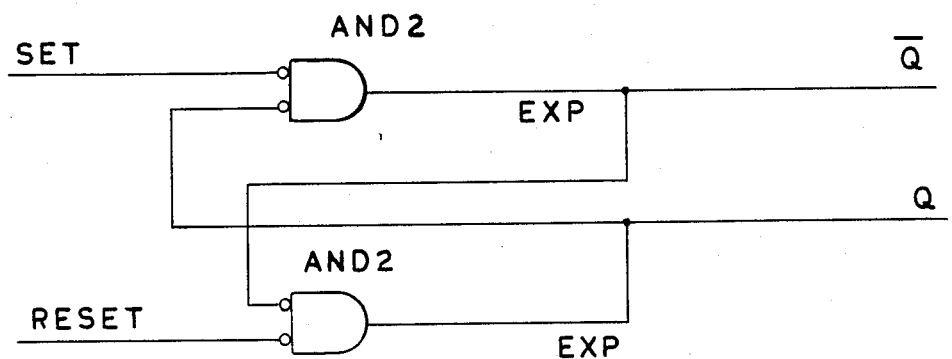

Expanders play an important role in this new architecture. As their name implies, these P-terms allow for growth. That is, they allow for implementation of those (less common) functions which do not fit within the three-P-term limit (for example, the 8-to-1 multiplexer can be fit into 9 expanders). Also, there are often common P-terms which can be used by a number of logic functions. These common P-terms can be formed by the expanders and then fed to those functions (which are likely to be implemented in a programmable AND, fixed OR section) for which they are required. The benefit is an overall saving in P-terms. Examples of various types of logic functions which can be fit into the P-term structure of the present invention are shown in FIGS. 7a through 7g. A further benefit of the expanders is in forming asynchronous latches. These latches require only two expanders. This structure is shown in FIG. 7h.

Continuing now with FIG. 4, XOR gate 107 receives its inputs from OR gate 105 and P-term INV. Those skilled in the art will recognize that if the logic signal on line 116 is 0, then the output of XOR gate 107 (line 121) will have the same logic value as input 115. On the other hand if line 116 is 1, then 121 will be the logical inversion of 115. In addition to allowing for inverted sum-of-product functions, or positive or inverted product-of-sum functions, this structure in conjunction with a D flip-flop such as 123 also allows for emulating other flip-flop types such as T, J-K, and R-S. Emulation of various flip-flop types using array logic and XOR gates is the subject of U.S. Pat. No. 4,677,318. When using the expander P-terms as an AND array and the P-terms feeding the OR gate 105 as an OR array, the INV signal 116 needs to be set to logic 1.

Figures 2, 8:
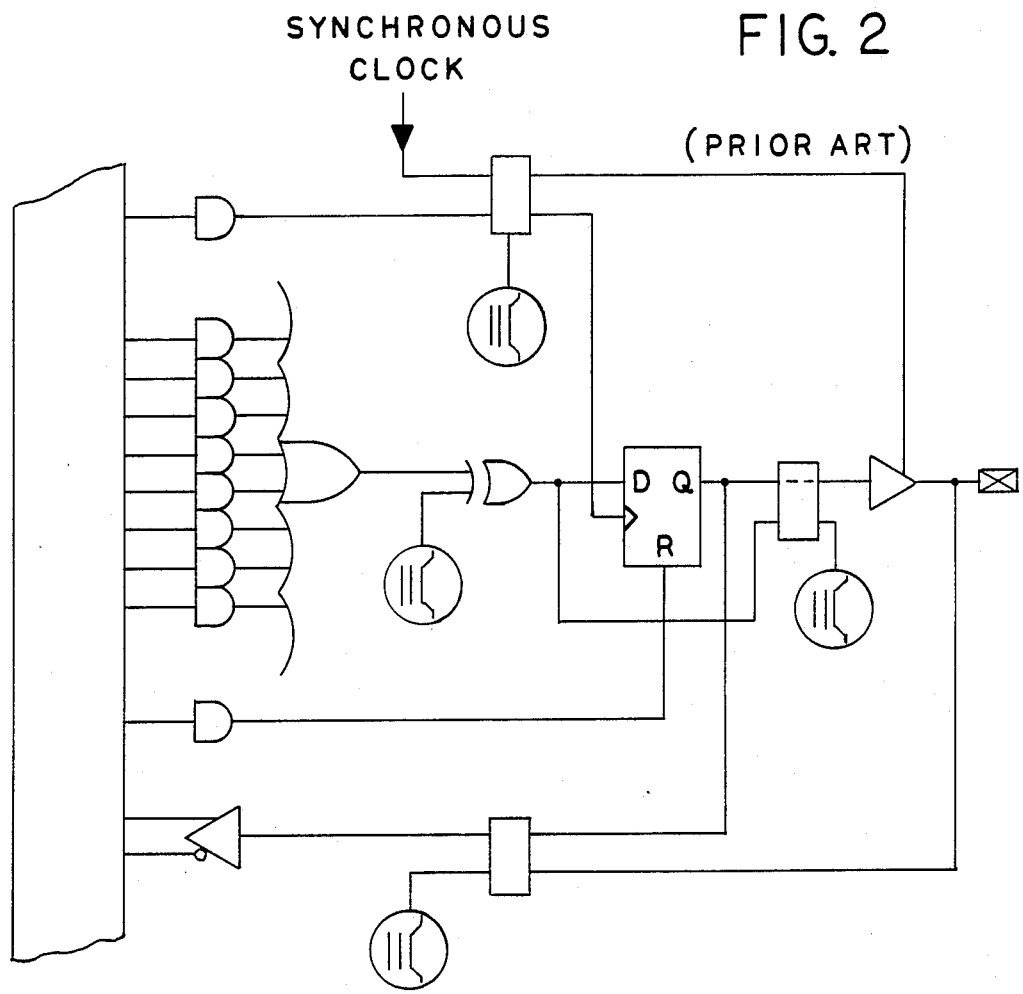
FIG. 2 is a prior art programmable logic circuit macrocell.
FIG. 8 is a truth table useful in explaining the operation of a new flip-flop-type element used in the device of this invention.
Figure 3A:
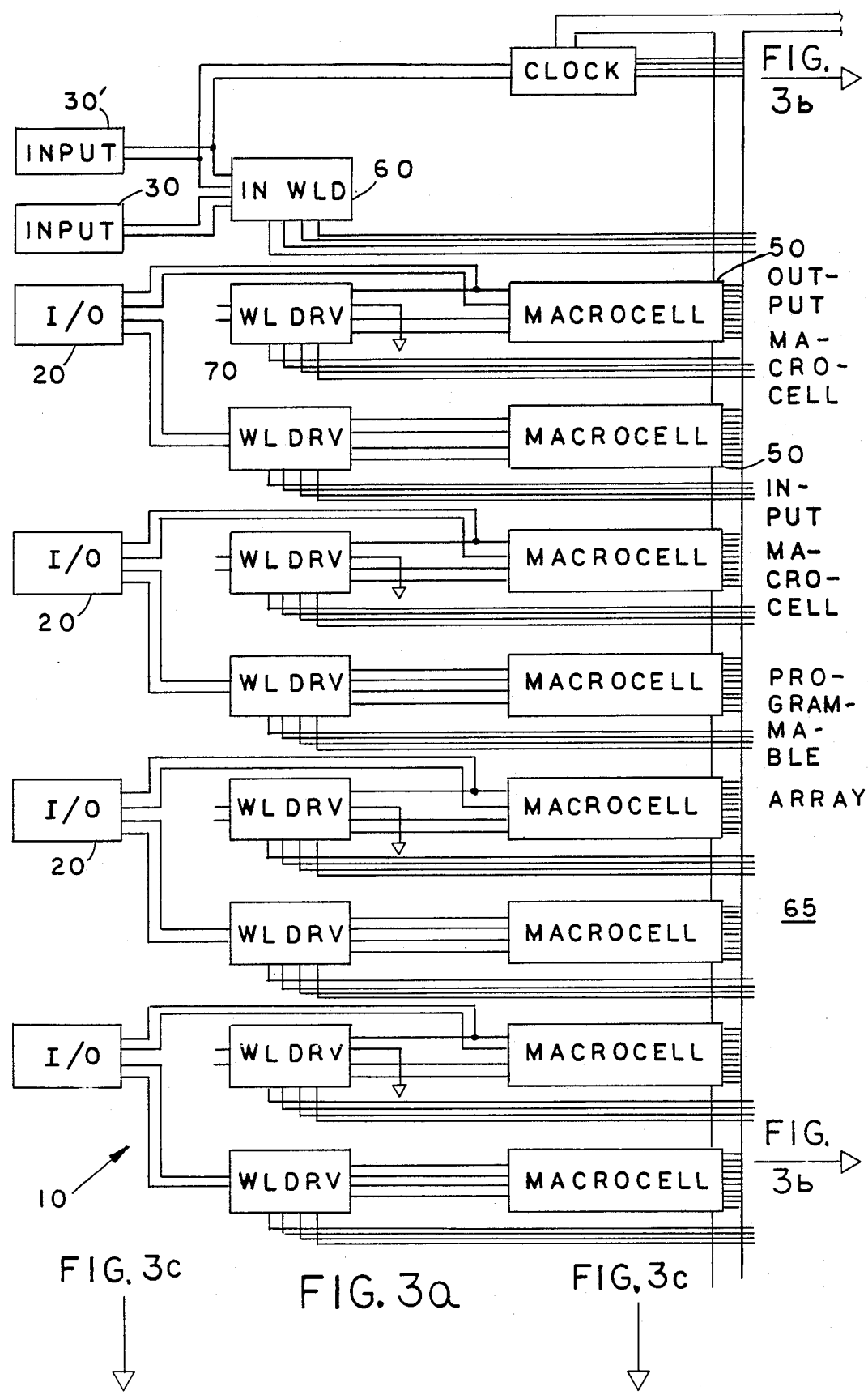

The flip-flop block 123 appears to be a simple D flip-flop with active low preset (PRE) and clear (CLR). However, this is done for simplicity of illustration of the macrocell. FIG. 8 is a truth table which defines the full functionality of element 123. Note that if PRE = CLR = 1, then 123 is an edge-triggered flip-flop. At the rising edge of CLK (line 122 in FIGS. 4–6), whatever data is present at the D input 121 is transferred to the Q output 124. If PRE is 0 and CLR is 1, then the Q output will be forced to 1 independent of the state of CLK or D. If CLR is 0 and PRE is 1, then the Q output will be forced to 0 independent of the state of CLK or D. To those skilled in the art, the case where PRE = CLR = 0 is an illegal or undefined condition. For flip-flop 123, however, when PRE = CLR = 0, the flip-flop is redefined as shown in the last three lines of FIG. 8. It thus becomes a "flowthrough latch". Then, whenever line 122 is high, the Q output takes the value of whatever is on the D input. Whenever line 122 is low, the Q output holds the value that was present at the D input when line 122 went low (this is indicated as Qo in FIG. 8). If line 22 is held high (for example, by programming P-term ACLK high), then signals will propagate directly from 121 to 124. This is the same "combinatorial" function as was provided by multiplexers and architectural control EPROM bits in prior art PLD circuits. This new design is simpler, faster, and provides greater functionality. As has been mentioned, a preferred structure for implementing flip-flop 123 is shown in concurrently filed, commonly assigned, co-pending patent application Ser. No. 190,530, which is hereby incorporated by reference herein.

The output signal 124 from flip-flop 123 feeds back (via buffer 54) to a word line driver 57 of the logic array. The signal 124 (Q) also feeds a conventional tri-state I/O buffer 42 such that if the buffer is enabled by line 47 (OE), the signal from 124 (Q) will drive off chip through I/O pin 40. I/O pin 40 can also provide an input path from off chip via line 44. This line drives buffer 43 (preferably a Schmitt trigger buffer) whose output becomes one of the sets of inputs to multiplexer 150 (in an input macrocell). I/O buffer 42 can be dynamically controlled by the OE P-term, in which case pin 40 may be both an input and an output depending upon the state of line 47. Alternatively, by programming the part such that OE is always 0, buffer 42 will always be disabled, in which case I/O pin 40 can be used permanently as an input. Thus each of I/O pins 40 can be configured as input, output, or bi-directional input/output terminals. Because of the feedback of signal 124 to the array, and the I/O input line 44, disabling of the output driver 42 does not result in loss of the macrocell's functionality. This is a significant advantage over some prior art devices.

Multiplexer 150 (active only in input macrocells) will now be described. Multiplexer 150 is a dual 2-to-1 multiplexer. That is, in an input macrocell it receives two sets of input lines and, depending on the state of line 47', chooses which of these sets of lines will be directed to output lines 151 and 152. One set of input lines is expander P-terms EXP1 and EXP2. The other set of input lines is the true and complement version of the I/O input signal 44 from I/O pin 40. The outputs of multiplexer 150 (lines 151 and 152) are connected to word line drivers 56 which feed the logic array. (In an output macrocell, EXP1 and EXP2 are always respectively connected to lines 151 and 152.) The purpose of multiplexer 150 is to choose between allowing the input macrocell expanders to feed back into the array or to allow the I/O input to feed into the array. Designs which are "input intensive" (that is require a lot of inputs) can choose to use the lines 151 and 152 to feed inputs into the array. On the other hand, if fewer inputs are needed, but the design is "logic intensive", then input macrocell expander feedback would be chosen. There is one multiplexer 150 for each of the I/O pins (16 in the preferred embodiment shown). However, there are 32 macrocells on the chip. Thus 16 of the 32 macrocells are output macrocells having no multiplexer 150. The expanders associated with the 16 output macrocells always feed back into the array, and so no multiplexer 150 is required in an output macrocell.

Figure 5A:
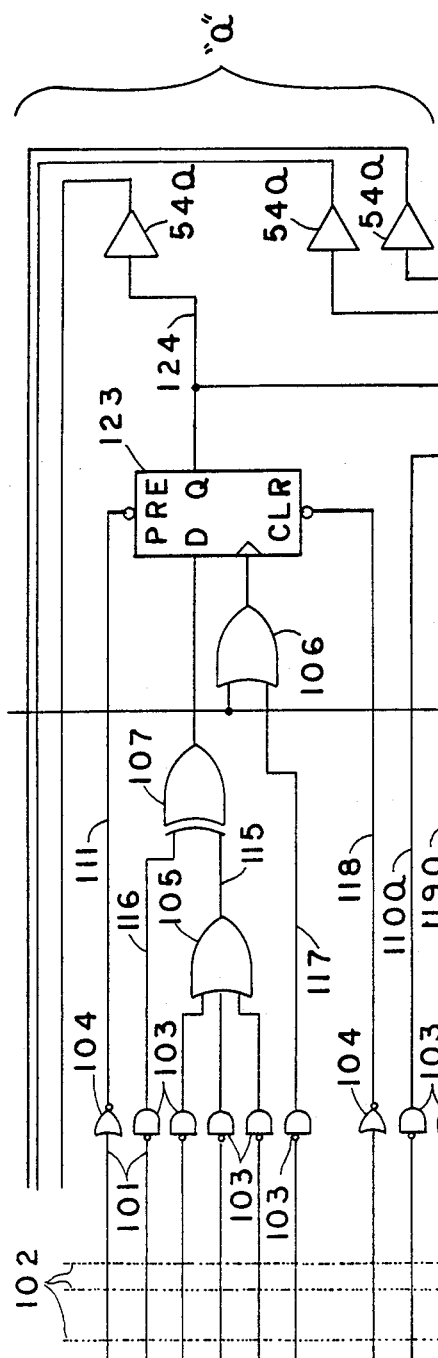
FIGS. 5a-5b are a block diagram of one section of a preferred embodiment of the present invention showing four macrocells (two of which are "output" macrocells and two of which are "input" macrocells), along with the interconnection structure.
Figure 5A:
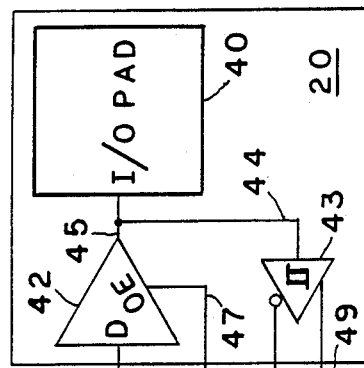
Figure 5B:
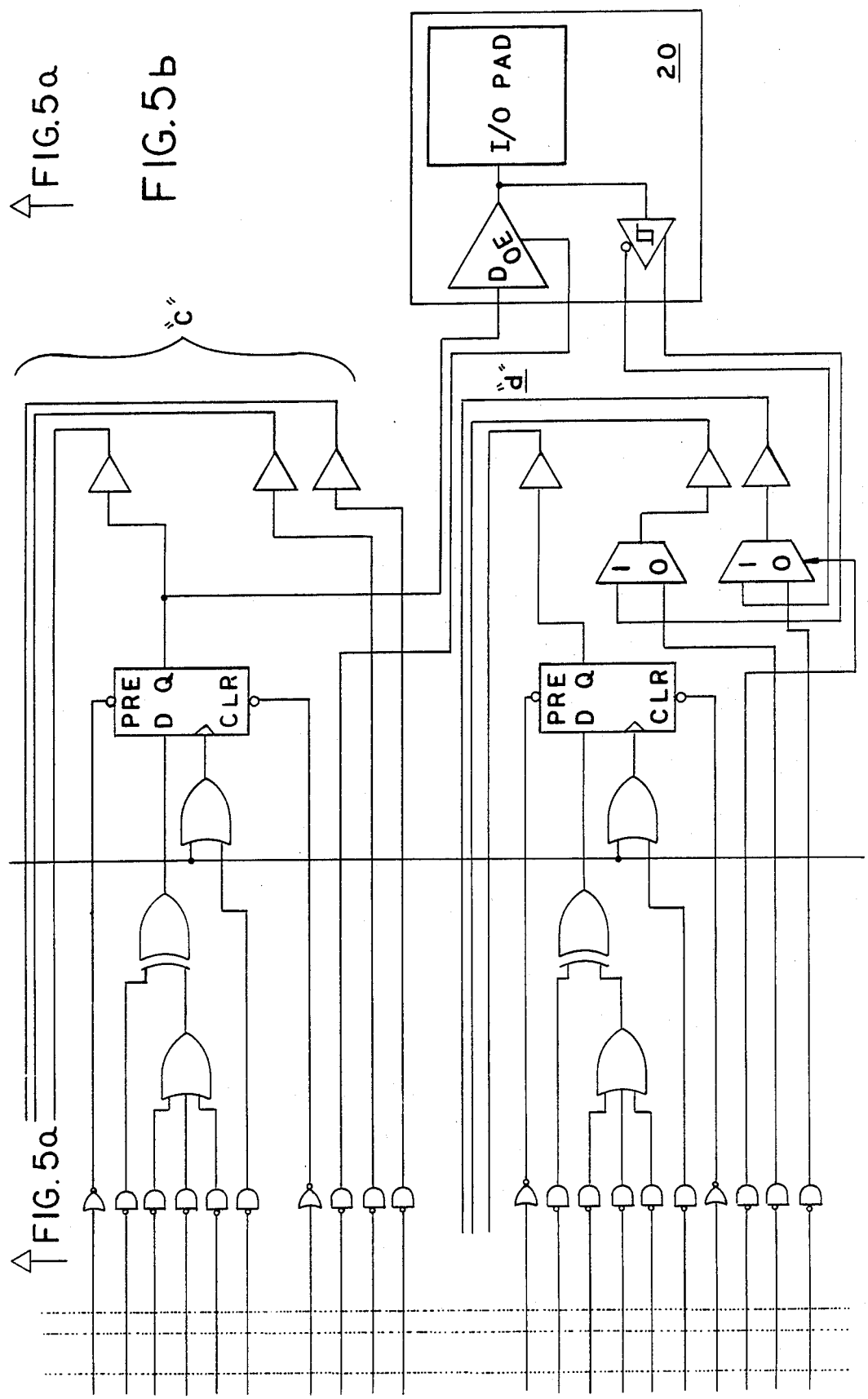

As shown in FIGS. 5a–5b, alternate macrocells a, c, etc., are preferably output macrocells, while the intervening macrocells b, d, etc., are preferably input macrocells. One I/O pad 40 is associated with each pair of an input macrocell and an output macrocell. In any pair of one output macrocell (e.g., a) and one input macrocell (e.g., b), only the signal 124 from the output macrocell is applied to the associated I/O pad 40 via the associated output driver 42, and that output driver is also selectively enabled by the OE output of the output macrocell. Similarly, the I/O pad signal (true and complement) is only applied to multiplexer 150 in the associated input macrocell, and the state of that multiplexer is controlled by the OE signal of the input macrocell. Thus only input macrocells b, d, etc., have multiplexers 150.

Figure 6:
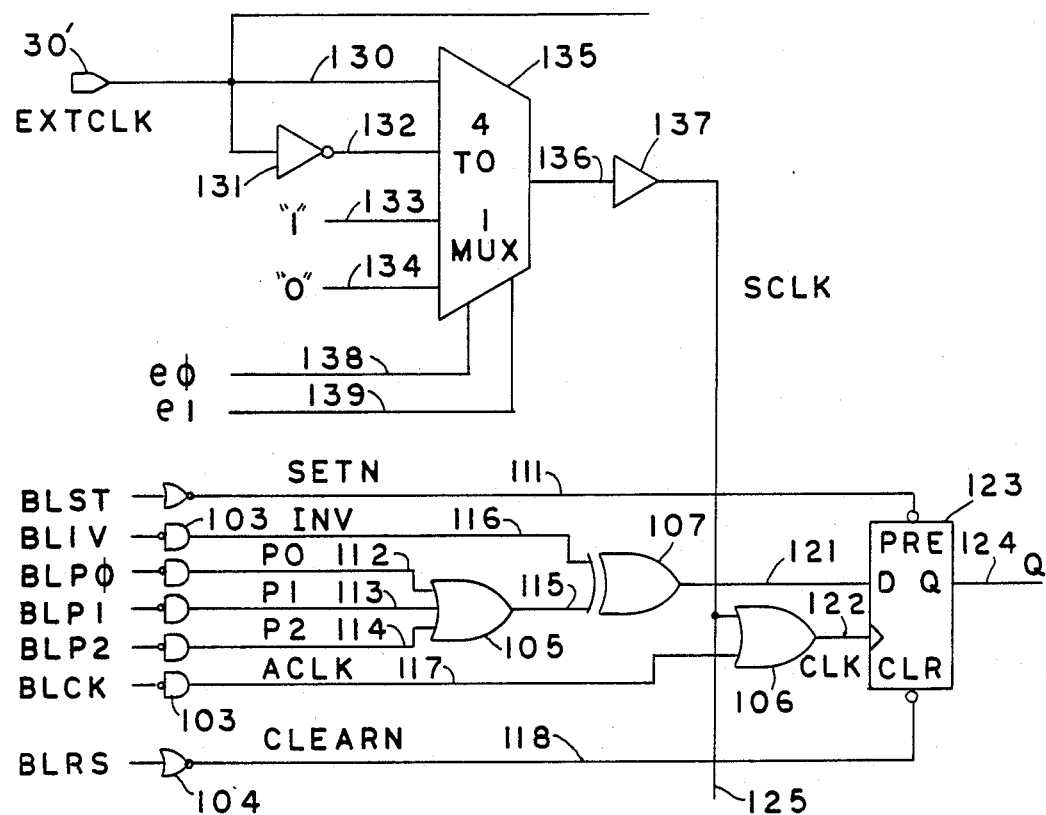
FIG. 6 is another representation of a portion of a macrocell along with the flip-flop clocking structure.

Referring to FIG. 6, we now describe the clock structure for the macrocell. This structure includes EXTCLK pin 30', inverter 131, multiplexer 135 with control signals 138 and 139, buffer 137, OR gate 106, P-term ACLK, and conventional programmable architecture control EPROM bits (not shown) for supplying signals e0 and e1. Three modes of operation are anticipated.

ASYNCHRONOUS MODE (e0 = 1, e1 = 1): In this case multiplexer 135 selects a logic 0 to be output to line 136 and, after buffering by 137, to drive line 125 to a logic 0. Then line 122 is directly controlled by the state of 117 (ACLK). ACLK can be any (inputs active-low) AND function of any of the word line variables. Each flip-flop in the part has its own separate "asynchronous" P-term clock.

SYNCHRONOUS MODE NON-INVERTED (e0 = 0, e1 = 0): P-term ACLK (117) is programmed to be always 0. Multiplexer 135 is set to direct the EXTCLK signal from pin 30' through to the input of buffer 137. Buffer 137 in turn drives line 125 with the EXTCLK signal. This signal on line 125 passes through OR gate 106 and appears on line 122. In this way, the external clock signal can directly control the clocking of flip-flop 123.

SYNCHRONOUS MODE INVERTED (e0 = 1, e1 = 0): P-term ACLK (117) is programmed to be always 0 Multiplexer 135 is set to direct the inverted EXTCLK signal from inverter 131 through to the input of buffer 137. Buffer 137 in turn drives line 125 with the inverted EXTCLK signal. This signal on line 125 passes through OR gate 106 and appears on line 122. In this way, the inverted external clock signal can directly control the clocking of flip-flop 123.

Referring back to FIGS. 3a–3d, we can view this device as consisting of two "halves": the "right half" and the "left half". Taking this view, there are two clock control circuits as previously described: one control circuit for the left half macrocells and one control circuit for the right half macrocells. In high-speed, synchronous, pipelined operations, it is often desirable to have one set of flip-flops clocked on the "rising" edge of a master clock and another set of flip-flops controlled by the "falling" edge of the same master clock. The last two clock modes just described provide exactly this functionality.

In any case, 117 can be high while 111 and 118 are low, thereby causing the associated flip-flop 123 to function as a flow-through device regardless of the selected clocking mode. This causes the D input of the flip-flop to flow through to the Q output of that device. Thus, combinatorial macrocells can always be interspersed with synchronously clocked macrocells on either side of the chip.

Although particular numbers of such components as macrocells, expanders, etc., are employed in the depicted embodiments described above, it will be understood that (among other possible variations within the scope of the invention that will occur to those skilled in the art) any number of such components can be used without departing from the scope and spirit of the invention.

The invention claimed is:

1. A programmable logic device for producing a plurality of first signals, each of which is a programmable logical function of a plurality of second signals, each of which is applied to a respective one of a plurality of word line conductors, said programmable logic device comprising:
a plurality of first P-term line conductors, each of which is programmably interconnectable to each of said work line conductors for producing on each of said first P-term line conductors a third signal which is a logical function of the second signals applied to the work line conductors to which the first P-term line conductor is interconnected;
means for logically combining said third signals to produce a first of said first signals;
at least one second P-term line conductor which is programmably interconnectable to each of said word line conductors for producing on said second P-term line conductor a second of said first signals which is a logical function of the second signals applied to the work line conductors to which said second P-term line conductor is interconnected;
means for receiving an input signal applied to the programmable logic device;
switch means for applying either the second of said first signals or said input signal to one of said work line conductors as the second signal applied to that work line conductor;
at least one third P-term line conductor which is programmably interconnectable to each of said work line conductors for producing on said third P-term line conductor a third of said first signals which is a logical function of the second signals applied to the word line conductor to which said third P-term line conductor is interconnected; and
means for applying the third of said first signals to said switch means for controlling said switch means to apply either the second of said first signals or said input signal to said one of said word line conductors.

2. The device defined in claim 1 further comprising:
at least two of said second P-term line conductors; and
means for forming parallel true and complement signal versions of said input signal; and
wherein said switch means applies either (1) the output signals of said two of said second P-term line conductors or (2) said true and complement signal versions of said input signal to two of said word line conductors, respectively.

3. The device defined in claim 2 further comprising:
at least one third P-term line conductor which is programmably interconnectable to each of said word line conductors for producing on said third P-term line conductor a third of said first signals which is a logical function of the second signals applied to the word line conductors to which said third P-term line conductor is interconnected; and
means for applying the third of said first signals to said switch means for controlling said switch means to apply either (1) the output signals of said two of said second P-term line conductors or (2) said true and complement signal versions to said two of said word line conductors, respectively.

4. The device defined in claim 1 wherein said means for receiving an input signal includes a Schmitt trigger for noise filtering said input signal.

5. A programmable logic device for producing a plurality of first signals, each of which is a programmable logical function of a plurality of second signals, each of which is applied to a respective one of a plurality of word line conductors, said programmable logic device comprising:
first and second macrocells, each including:
(a) a plurality of first P-term line conductors, each of which is programmably interconnectable to each of said word line conductors for producing on each of said first P-term line conductors a third signal which is a logical function of the second signals applied to the word line conductors to which that first P-term line conductor is interconnected;
(b) means for logically combining said third signals to produce a first of said first signals; and
(c) at least one second P-term line conductor which is programmably interconnectable to each of said word line conductors for producing on said second P-term line conductor a second of said first signals which is a logical function of the second signals applied to the word line conductors to which said second P-term line conductor is interconnected; and
means for receiving an input signal applied to the programmable logic device;
wherein said first macrocell further includes means for applying the signal on said second P-term line conductor of said first macrocell to a first of said work line conductors as the second signal applied to that word line conductor; and
wherein said second macrocell further includes switch means for selectively applying either the signal on said second P-term line conductor of said second macrocell or said input signal to a second of said work line conductors as the second signal applied to that word line conductor.

6. The device defined in claim 5 wherein said means for receiving an input signal is alternatively usable for conveying a signal from the programmable logic device as an output signal; and wherein said programmable logic device further comprises output driver means for selectively applying the first of said first signals of said first macrocell to said means for receiving as said output signal.

7. The device defined in claim 6 wherein each of said macrocells further includes at least one third P-term line conductor which is programmably interconnectable to each of said word line conductors for producing on said third P-term line conductor a third of said first signals which is a logical function of the second signals applied to the word line conductors to which said third P-term line conductor is interconnected; wherein said first macrocell further includes means for applying the signal on said third P-term line conductor of said first macrocell to said output driver means for controlling whether said output driver means applies a signal to said means for receiving as said output signal; and wherein said second macrocell further includes means for applying the signal on said third P-term line conductor of said second macrocell to said switch means for controlling whether said switch means applies the signal on said second P-term line conductor of said second macrocell or said input signal to said second word line conductor.

8. The device defined in claim 5 wherein said first macrocell further includes means for applying the first of said first signals of said first macrocell to a third of said word line conductors as the second signal applied to that word line conductor; and wherein said second macrocell further includes means for applying the first of said first signals of said second macrocell to a fourth of said word line conductors as the second signal applied to that word line conductor.

9. The device defined in claim 5 wherein said means for receiving an input signal includes a Schmitt trigger for filtering said input signal.

10. In a programmable logic device having (1) a plurality of word line conductors; (2) a plurality of P-term line conductors, each of which is programmably interconnectable to at least some of said word line conductors for producing on each P-term line conductor a signal which is a logical function of the signals on the word line conductors to which that P-term line conductor is interconnected; and (3) a clock signal utilization device for processing a signal derived from at least one first P-term line conductor in accordance with an applied clock signal, the improvement comprising:

means for providing a synchronous clock signal;

means responsive to said synchronous clock signal for providing an inverted version of said synchronous clock signal;

means responsive to the signal on at least one second P-term line conductor for providing an asynchronous clock signal which is a logical function of the signal on said second P-term line conductor; and programmable means for selecting one of said synchronous clock signal, said inverted version of said synchronous clock signal, and said asynchronous clock signal as the clock signal applied to said clock signal utilization device.

* * * * *